United States Patent
Choi

[19]

[11] Patent Number: 5,903,508
[45] Date of Patent: May 11, 1999

[54] INPUT BUFFER OF MEMORY DEVICE FOR REDUCING CURRENT CONSUMPTION IN STANDBY MODE

[75] Inventor: Jae Myoung Choi, Ichon, Rep. of Korea

[73] Assignee: Hyundai Electronics Industries Co., Ltd., Kyoungki-do, Rep. of Korea

[21] Appl. No.: 08/979,227

[22] Filed: Nov. 26, 1997

[30] Foreign Application Priority Data

Dec. 13, 1996 [KR] Rep. of Korea ........................ 96-80249

[51] Int. Cl.⁶ ........................................... G11C 7/00
[52] U.S. Cl. ..................... 365/229; 365/189.05; 365/236
[58] Field of Search ..................... 365/229, 223, 365/189.05, 227, 236

[56] References Cited

U.S. PATENT DOCUMENTS

5,542,067  7/1996  Chappel ................................. 365/203
5,673,398  9/1997  Takeda .................................. 395/285

*Primary Examiner*—A. Zarabean
*Attorney, Agent, or Firm*—Gary M. Nath; Nath & Associates

[57] ABSTRACT

An input buffer of memory device for reducing current consumption in standby mode comprising a bus input buffer for inputting successive bus data signals through a bus and buffering the inputted bus data signals, and a flag buffer for generating a control signal in response to a system clock signal and a flag signal indicative of a bus data input time point to operate the bus input buffer before a first one of the bus data signals arrives at the bus input buffer and to allow the bus input buffer to enter a standby mode at once after the bus data signal input is completed, the flag signal being enabled before the first bus data signal is inputted and disabled before the bus data signal input is completed. According to the present invention, signal increase can be suppressed and power consumption can be reduced.

6 Claims, 8 Drawing Sheets

INPUT BUFFER OF MEMORY DEVICE FOR REDUCING CURRENT CONSUMPTION IN STANDBY MODE

BACKGROUND OF THE INVENTION

1. Field of the Invention

The present invention relates in general to a input buffer of semi conductor memory device, and more particularly to input buffer of memory device for reducing current consumption in standby mode in which current to be consumed in an input buffer is interrupted when the input buffer is not operated. The present invention is applicable to all elements employing a packet protocol, such as a rambus, a synchronous link, etc..

2. Description of the Prior Art

Figure 1:
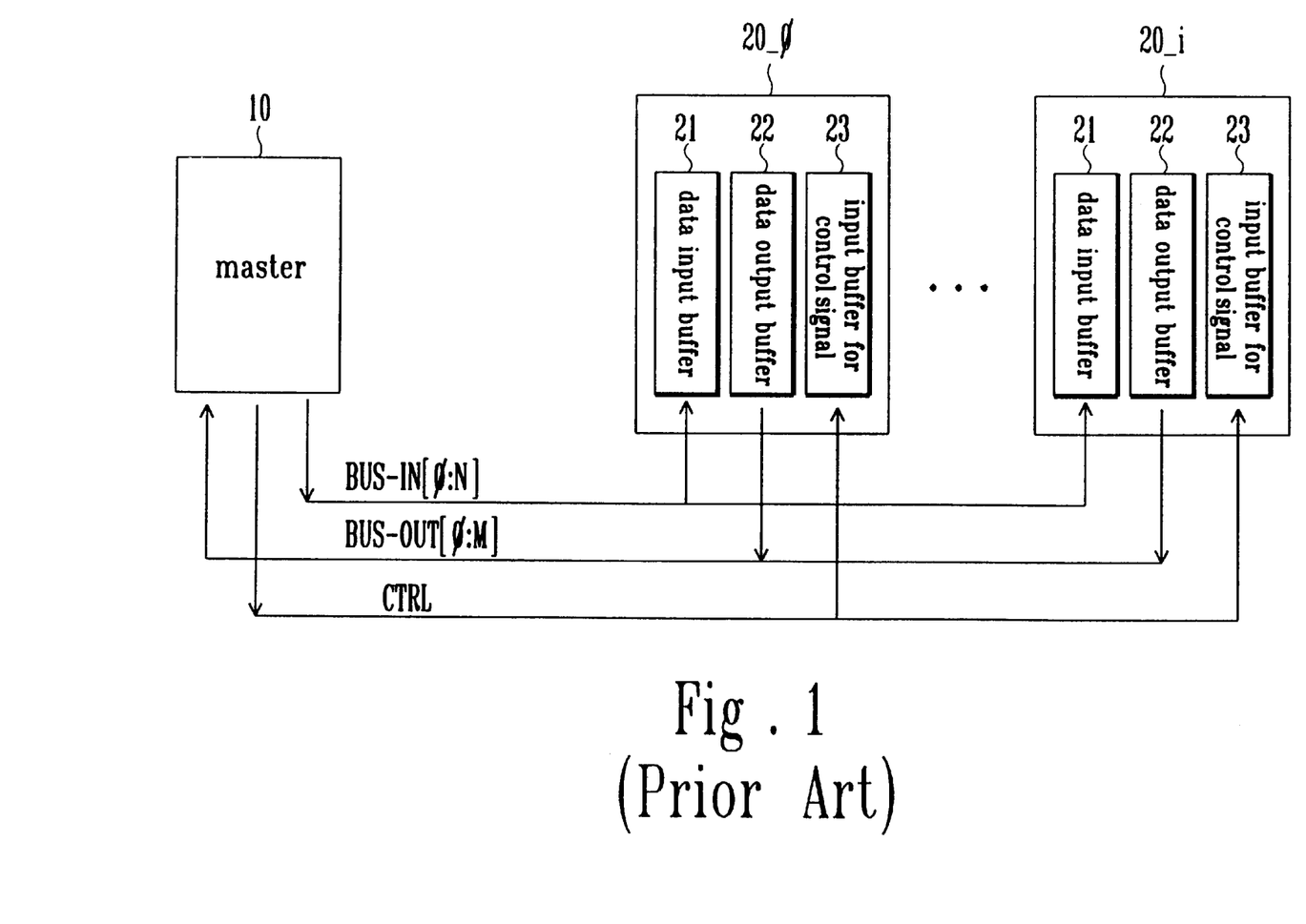
FIG. 1 is a block diagram of a conventional high-speed device.

FIG. 1 is a block diagram of a conventional high-speed device and FIGS. 2a to 2e are timing diagrams of signals transferred between a master 10 and slaves 20_0–20_i in FIG. 1.

Figure 2:
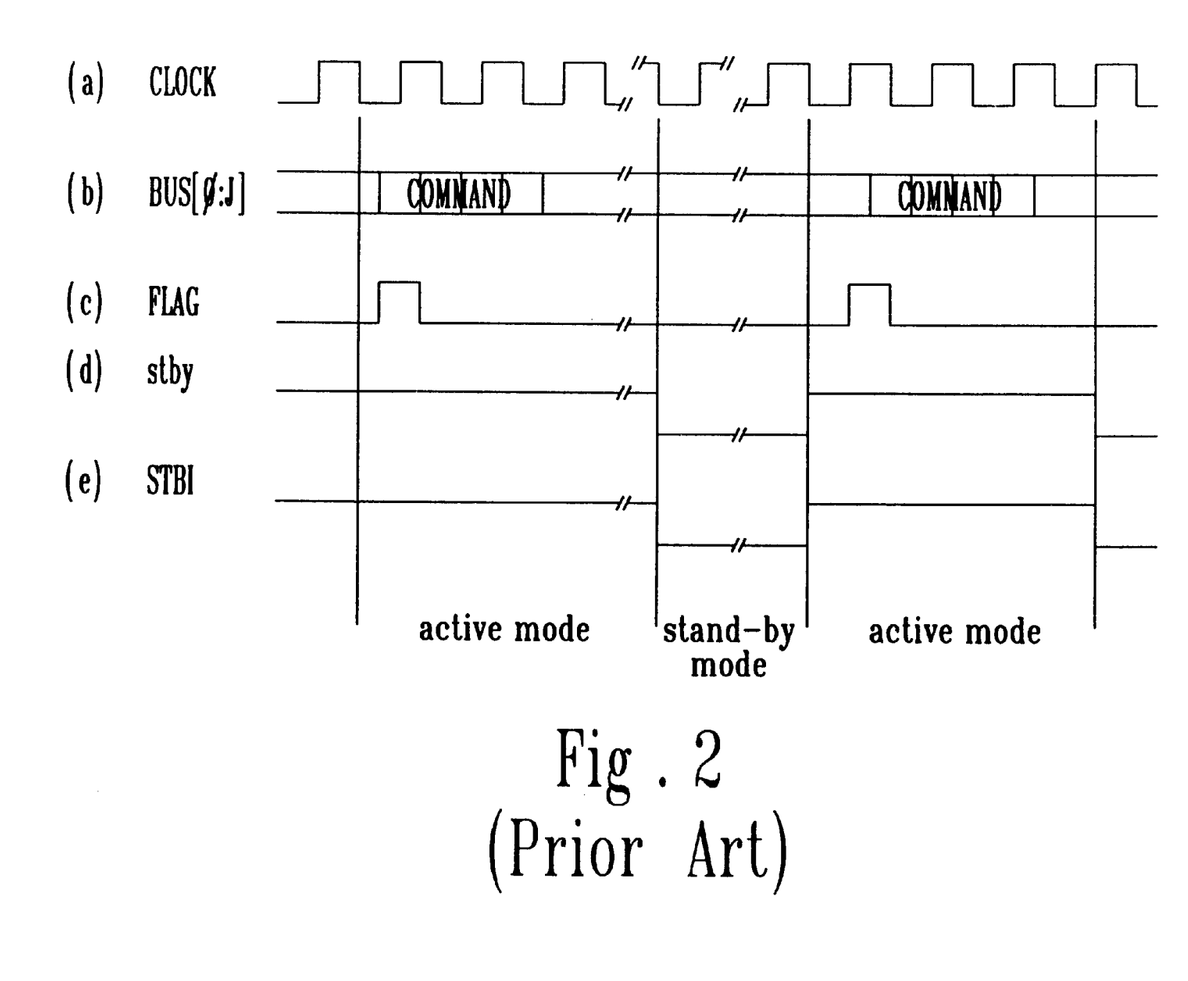
FIGS. 2a to 2e are timing diagrams of signals transferred between a master and slaves in FIG. 1.

Conventionally, at the same time that the master 10 transfers data to the slaves 20_0–20_i through a bus, it sends a flag signal as shown in FIG. 2c to indicate the data transfer through the bus. In this case, the slaves 20_0–20_i receive the first data on the bus when they buffer the flag signal, thereby making it impossible to control input buffers of the slaves 20_0–20_i using the flag signal. For this reason, a standby mode signal Stby as shown in FIG. 2d is used to inform the slaves 20_0–20_i of a standby mode. The standby mode signal Stby is disabled earlier than the flag signal to make the bus input possible. Also, after the bus input is completed, the standby mode signal Stby is enabled to allow the slaves 20_0–20_i to enter the standby mode. As a result, there is conventionally required a time margin between the flag signal and the standby mode signal Stby. Further, the number of control signals is increased in that the standby mode signal Stby is required in addition to the flag signal to control the standby mode. Moreover, standby mode signal input buffers (standby mode detection input buffers) in the slaves 20_0–20_i must continuously be operated to recognize a time point where the standby mode signal Stby from the master 10 is received. In result, even when the slaves 20_0–20_i are in the standby mode, the standby mode detection input buffers are continuously operated, resulting in continuous power consumption.

Figure 3:
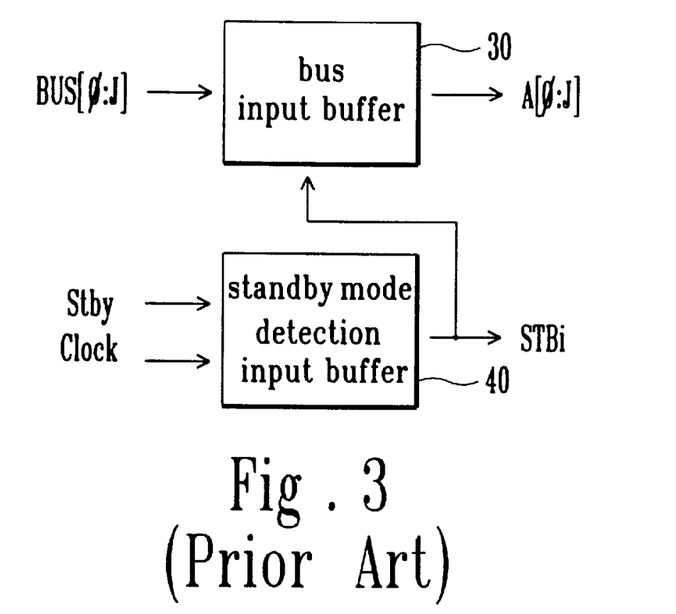
FIG. 3 is a block diagram illustrating the construction of a bus input buffer and a standby mode detection input buffer in each of the slaves in FIG. 1.

FIG. 3 is a block diagram illustrating the construction of a bus input buffer and a standby mode detection input buffer in each of the slaves 20_0–20_i in FIG. 1. In this drawing, the bus input buffer is designated by the reference numeral 30 and the standby mode detection input buffer is designated by the reference numeral 31. The standby mode detection input buffer 31 is adapted to inform the bus input buffer 30 of the standby mode in response to a clock signal and the standby mode signal Stby. The bus input buffer 30 is adapted to buffer an input bus signal BUS[0:j] in a normal mode in response to an output signal STBi from the standby mode detection input buffer 31.

Figure 4:
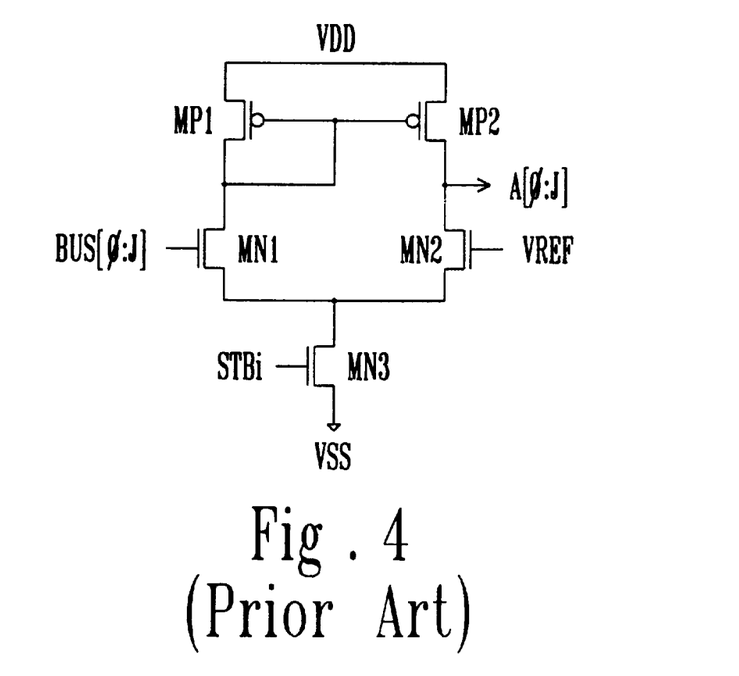
FIG. 4 is a circuit diagram of the bus input buffer in FIG. 3.

FIG. 4 is a circuit diagram of the bus input buffer 30 in FIG. 3. As shown in this drawing, the bus input buffer 30 is provided with a differential amplifier for receiving the bus signal BUS[0:j] and a reference voltage Vref to perform a differential amplification operation. The differential amplifier is controlled in operation by the output signal STBi from the standby mode detection input buffer 31.

SUMMARY OF THE INVENTION

Therefore, the present invention has been made in view of the above problem, and it is an object of the present invention to provide an input buffer of memory device for reducing current consumption in standby mode in which a flag signal indicative of a master-slave data transfer time point is generated earlier than bus data to operate a bus input buffer before the bus data arrives at the bus input buffer and to allow the bus input buffer to enter a standby mode at once after the bus input is completed, so that signal increase can be suppressed and power consumption can be reduced.

In accordance with one aspect of the present invention, there is provided an input buffer of memory device for reducing current consumption in standby mode comprising bus input buffering means for inputting successive bus data signals through a bus and buffering the inputted bus data signals; and control means for generating a control signal in response to a system clock signal and a flag signal indicative of a bus data input time point to operate the bus input buffering means before a first one of the bus data signals arrives at the bus input buffering means and to allow the bus input buffering means to enter a standby mode at once after the bus data signal input is completed, the flag signal being enabled before the first bus data signal is inputted and disabled before the bus data signal input is completed.

In accordance with another aspect of the present invention, there is provided an input buffer of memory device for reducing current consumption in standby mode comprising bus input buffering means for inputting successive bus data signals through a bus and buffering the inputted bus data signals; control means for generating a control signal in response to a system clock signal and a flag signal indicative of a bus data input time point to operate the bus input buffering means before a first one of the bus data signals arrives at the bus input buffering means and to allow the bus input buffering means to enter a standby mode at once after the bus data signal input is completed, the flag signal being enabled before the first bus data signal is inputted and disabled before the bus data signal input is completed; and bus signal counting means for counting the number of the bus data signals in response to the control signal from the control means to control the bus input buffering means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 5:
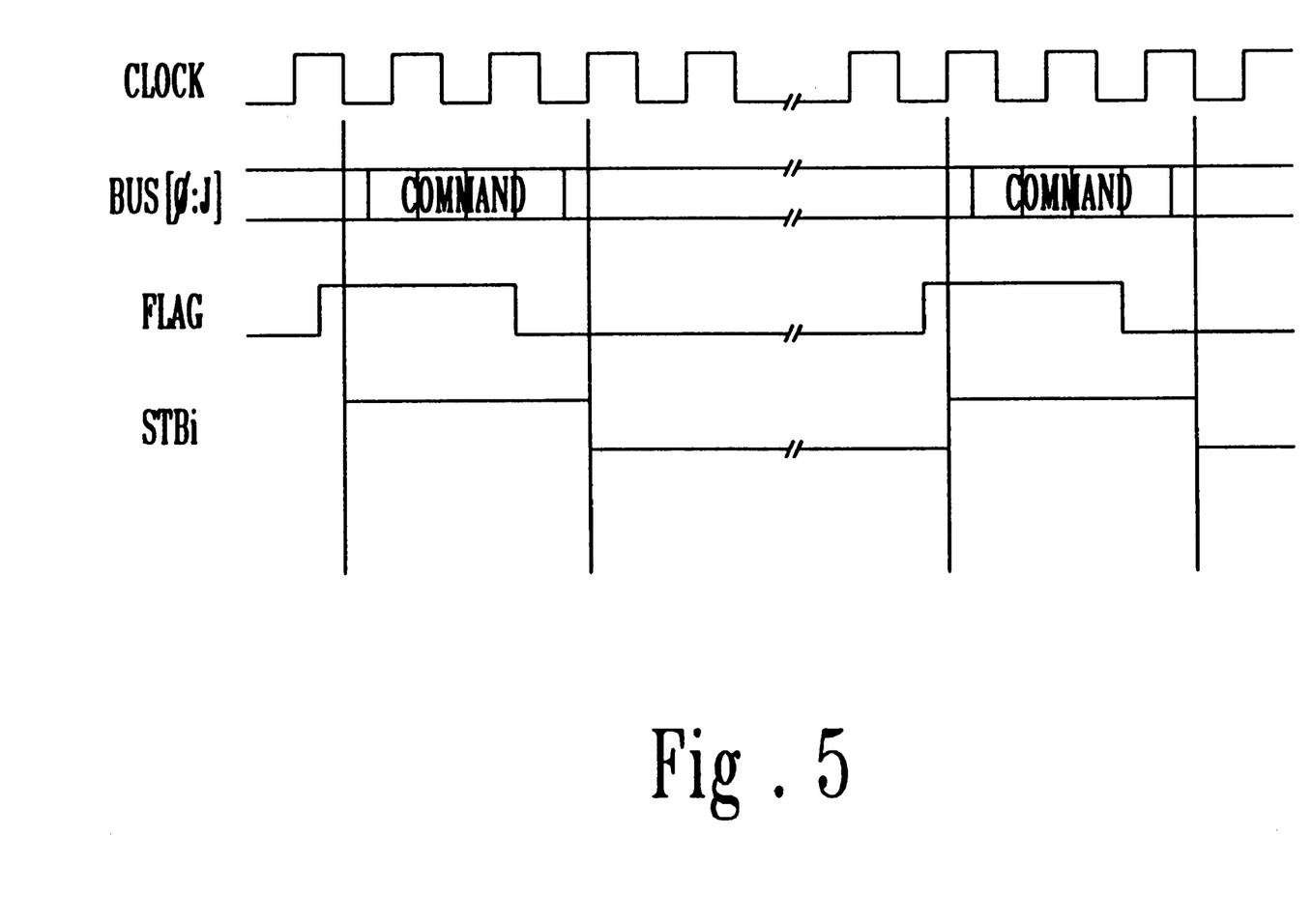
FIG. 5 is a timing diagram of signals transferred between a master and slaves in accordance with a first embodiment of the present invention.

FIG. 5 is a timing diagram of signals transferred between a master and slaves in accordance with a first embodiment of the present invention. A flag signal is generated earlier than a bus signal BUS[0:j] and then disabled before the bus input is completed. As a result, if the bus input is completed, a bus input buffer automatically enters a standby mode so that it cannot be operated. This has the effect of reducing power consumption. Then, when the flag signal is again applied, the bus input buffer enters a normal mode again to input a new bus signal.

Figure 6:
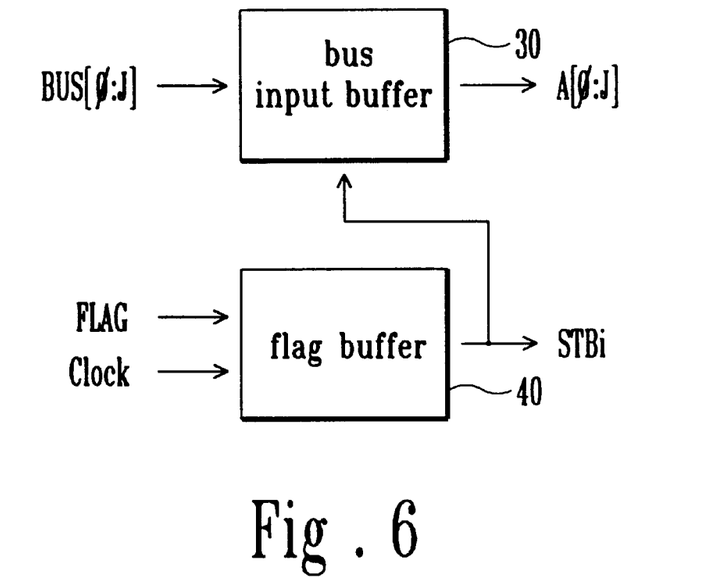
FIG. 6 is a block diagram illustrating the construction of a bus input buffer and a flag buffer in each of the slaves in accordance with the first embodiment of the present invention.

FIG. 6 is a block diagram illustrating the construction of a bus input buffer and a flag buffer in each of the slaves in accordance with the first embodiment of the present invention. In this drawing, the bus input buffer is designated by the reference numeral 30 and the flag buffer is designated by the reference numeral 40. The flag buffer 40 provides its output signal STBi to the bus input buffer 30 in response to the flag signal and a clock signal to control the bus input. The bus input buffer 30 is adapted to buffer an input bus signal BUS[0:j] in the normal mode in response to the output signal STBi from the flag buffer 40.

Figure 7:
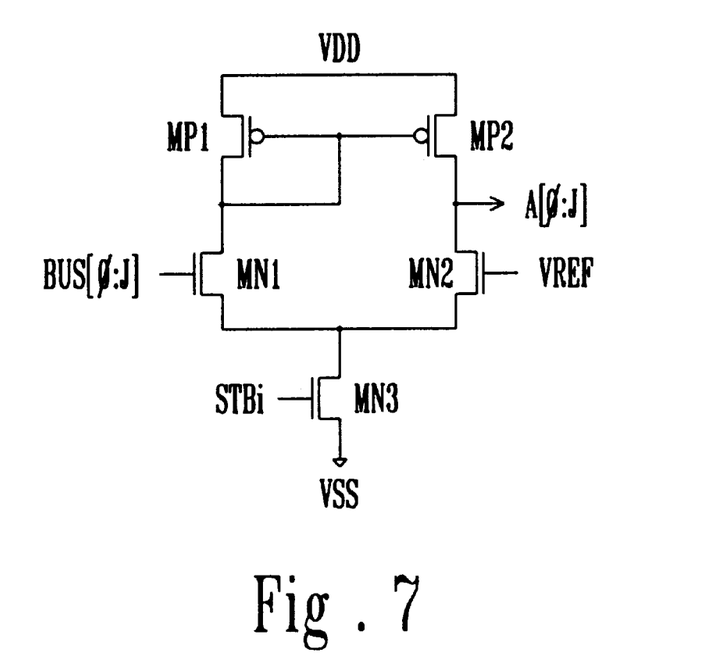
FIG. 7 is a circuit diagram of the bus input buffer in FIG. 6.

FIG. 7 is a circuit diagram of the bus input buffer 30 in FIG. 6. As shown in this drawing, the bus input buffer 30 is provided with a differential amplifier for receiving the bus signal BUS[0:j] and a reference voltage Vref to perform a differential amplification operation. The differential amplifier is controlled in operation by the output signal STBi from the flag buffer 40.

Figure 8:
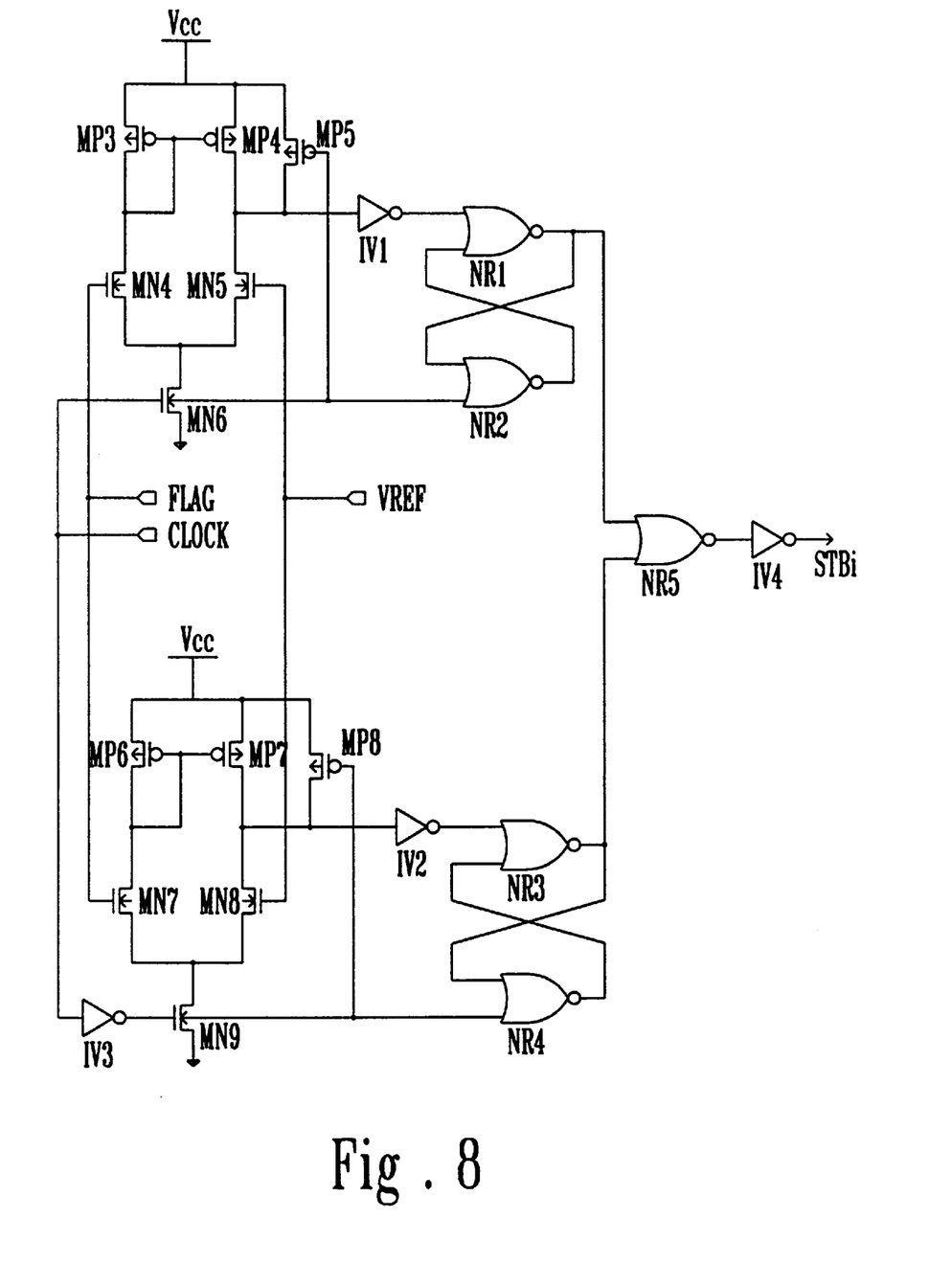
FIG. 8 is a circuit diagram of the flag buffer in FIG. 6.

FIG. 8 is a circuit diagram of the flag buffer 40 in FIG. 6. The flag buffer 40 is operable at both rising and falling edges of the clock signal. To this end, the flag buffer 40 includes a first buffer stage for receiving the clock signal directly, and a second buffer stage for receiving an inverted one of the clock signal. Each of the first and second buffer stages includes a latch stage for latching the flag signal in response to the corresponding clock signal. Finally, output signals from the latch stages of the first and second buffer stages are logically combined to generate the signal STBi.

The operation of the above-mentioned construction in accordance with the first embodiment of the present invention will hereinafter be described in detail.

As mentioned above, each slave includes the input buffers for receiving the bus, control and clock signals, respectively. One of the control signals, or the flag signal is applied before the first bus signal is transferred, to indicate the bus signal transfer. The flag signal is synchronized with the clock signal to generate the bus input buffer control signal to control the input of the bus signal. The bus input buffer control signal is disabled synchronously with the clock signal before the last bus signal is inputted. As a result, after the last bus signal is inputted, the bus input buffer is not operated. Also, the bus input buffer control signal is enabled synchronously with the clock signal before the first bus signal is inputted. As a result, the bus input buffer is operated to input the first bus signal.

Figure 9:
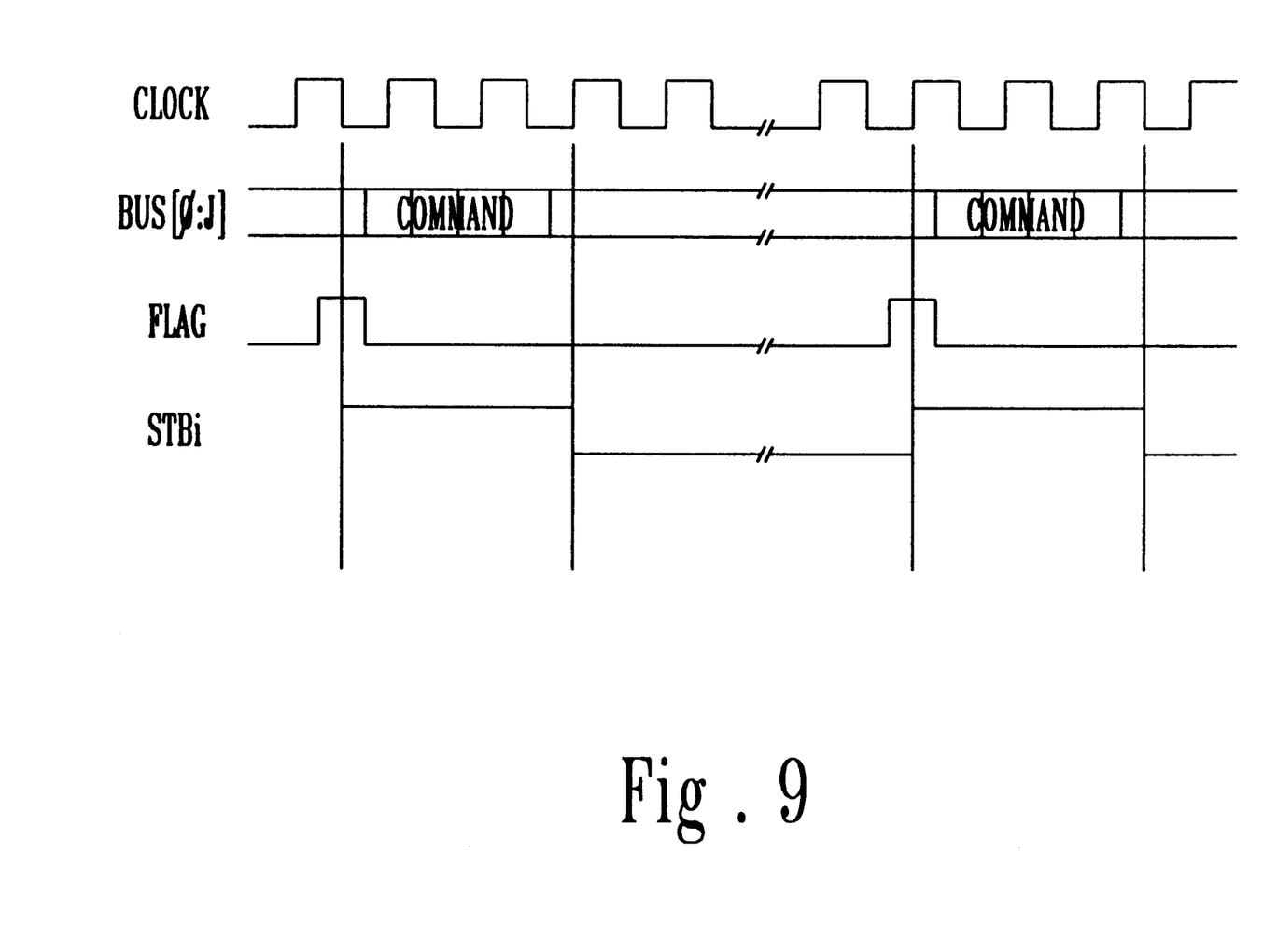
FIG. 9 is a timing diagram of signals transferred between a master and slaves in accordance with a second embodiment of the present invention.
Figure 10:
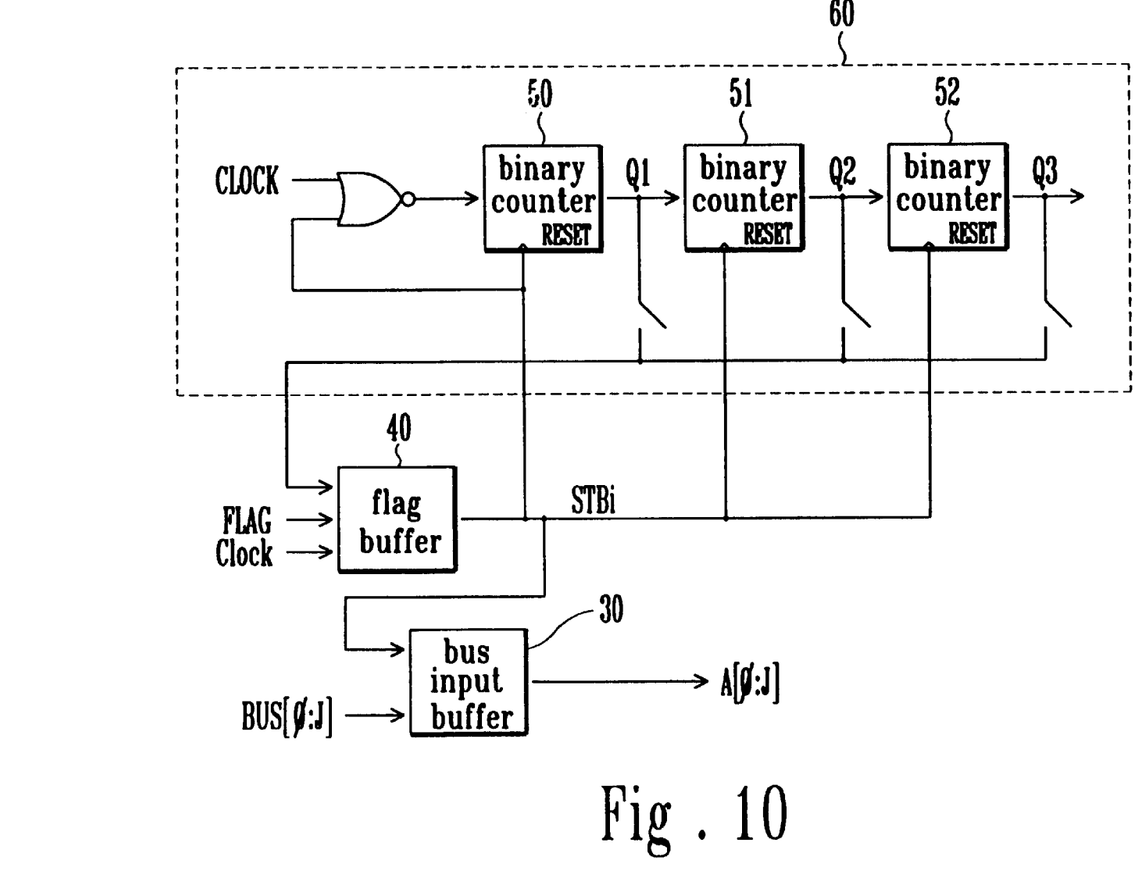
FIG. 10 is a block diagram illustrating the construction of a bus input buffer, a flag buffer and a bus signal counting circuit in each of the slaves in accordance with the second embodiment of the present invention.

FIG. 9 is a timing diagram of signals transferred between a master and slaves in accordance with a second embodiment of the present invention and FIG. 10 is a block diagram illustrating the construction of a bus input buffer, a flag buffer and a bus signal counting circuit in each of the slaves in accordance with the second embodiment of the present invention. In FIG. 10, the bus input buffer is designated by the reference numeral 30, the flag buffer is designated by the reference numeral 40 and the bus signal counting circuit is designated by the reference numeral 60. Successive bus data signals are transferred from the master to the slaves through a bus. A flag signal is generated before the first bus data signal is inputted, to indicate a master-slave data transfer time point. The bus input buffer 30 is adapted to buffer the bus data signals in a normal mode. The flag buffer 40 is adapted to operate the bus input buffer 30 before the first bus data signal arrives at the bus input buffer 30 and to allow the bus input buffer 30 to enter a standby mode at once after the bus data signal input is completed. The bus signal counting circuit 60 is adapted to count the number of successive bus data signals in response to an output signal STBi from the flag buffer 40 to control the bus input buffer 30.

The operation of the above-mentioned construction in accordance with the second embodiment of the present invention will hereinafter be described in detail.

The flag signal is enabled only before the first bus signal is inputted, and disabled in the other interval. When the flag signal is enabled, the signal STBi is generated and applied to reset terminals of binary counters in the bus signal counting circuit 60, thereby controlling the bus input buffer 30.

In more detail, each slave includes the input buffers for receiving the bus, control and clock signals, respectively. One of the control signals, or the flag signal is applied before the first bus signal is transferred, to indicate the bus signal transfer. The flag signal is synchronized with the clock signal to generate the bus input buffer control signal to control the input of the bus signal. The bus input buffer control signal is enabled synchronously with the clock signal before the first bus signal is inputted. As a result, the bus input buffer is operated to input the successive bus signals. At this time, the bus signal counting circuit counts the number of the successive bus signals. When the counted value is in accord with a predetermined value, the bus signal counting circuit controls the bus input buffer in such a manner that it cannot be operated. As a result, no power is consumed in the bus input buffer. Noticeably, the output signal from the bus signal counting circuit is made active only when the bus input buffer control signal is at its disable state.

As apparent from the above description, according to the present invention, the flag signal indicative of the master-slave data transfer time point is generated earlier than the bus data to operate the bus input buffer before the bus data arrives at the bus input buffer and to allow the bus input buffer to enter the standby mode at once after the bus input is completed. Therefore, signal increase can be suppressed and power consumption can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An input buffer of memory device for reducing current consumption in standby mode comprising:
    bus input buffering means for inputting successive bus data signals through a bus and buffering the inputted bus data signals; and control means for generating a control signal in response to a system clock signal and a flag signal indicative of a bus data input time point to operate said bus input buffering means before a first one of said bus data signals arrives at said bus input buffering means and to allow said bus input buffering means to enter a standby mode at once after the bus data signal input is completed, said flag signal being enabled before said first bus data signal is inputted and disabled before the bus data signal input is completed.

2. An input buffer of memory device for reducing current consumption in standby mode as set forth in claim 1, wherein said control means includes:

a first input buffer operated when said clock signal goes from low to high in logic; and a second input buffer operated when said clock signal goes from high to low in logic.

3. An input buffer of memory device for reducing current consumption in standby mode as set forth in claim 1, wherein said control signal from said control means is enabled before said first bus data signal is inputted and disabled before a last one of said bus data signals is inputted.

4. An input buffer of memory device for reducing current consumption in standby mode comprising:

bus input buffering means for inputting successive bus data signals through a bus and buffering the inputted bus data signals;

control means for generating a control signal in response to a system clock signal and a flag signal indicative of a bus data input time point to operate said bus input buffering means before a first one of said bus data signals arrives at said bus input buffering means and to allow said bus input buffering means to enter a standby mode at once after the bus data signal input is completed, said flag signal being enabled before said first bus data signal is inputted and disabled before the bus data signal input is completed; and bus signal counting means for counting the number of said bus data signals in response to said control signal from said control means to control said bus input buffering means.

5. An input buffer of memory device for reducing current consumption in standby mode as set forth in claim 4, wherein said control signal from said control means is enabled before said first bus data signal is inputted.

6. An input buffer of memory device for reducing current consumption in standby mode as set forth in claim 4, wherein said control means includes:

a first input buffer operated when said clock signal goes from low to high in logic;

a second input buffer operated when said clock signal goes from high to low in logic; and a logic circuit for logically combining output signals from said first and second input buffers and outputting the logically combined result as said control signal.

* * * * *